United States Patent
Kadohashi

(10) Patent No.: US 10,988,637 B2
(45) Date of Patent: Apr. 27, 2021

(54) POLISHING COMPOSITION AND POLISHING SYSTEM

(71) Applicant: FUJIMI INCORPORATED, Kiyosu (JP)

(72) Inventor: Yusuke Kadohashi, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 16/559,073

(22) Filed: Sep. 3, 2019

(65) Prior Publication Data

US 2020/0071568 A1    Mar. 5, 2020

(30) Foreign Application Priority Data

Sep. 4, 2018  (JP) .............................. JP2018-165036

(51) Int. Cl.
| | | |
|---|---|---|
| *C09G 1/02* | (2006.01) | |
| *H01L 21/3105* | (2006.01) | |
| *H01L 21/321* | (2006.01) | |

(52) U.S. Cl.
CPC .......... *C09G 1/02* (2013.01); *H01L 21/31053* (2013.01); *H01L 21/3212* (2013.01)

(58) Field of Classification Search
None
See application file for complete search history.

(56) References Cited

U.S. PATENT DOCUMENTS

| 2003/0115806 A1 | 6/2003 | Takami | |
|---|---|---|---|
| 2009/0057661 A1* | 3/2009 | Siddiqui | .................. C09G 1/02 257/42 |
| 2012/0094491 A1* | 4/2012 | Kanamaru | .......... H01L 21/3212 438/693 |

FOREIGN PATENT DOCUMENTS

JP    2003-142435 A    5/2003

* cited by examiner

*Primary Examiner* — Roberts P Culbert
(74) *Attorney, Agent, or Firm* — Foley & Lardner LLP

(57) ABSTRACT

A polishing composition according to the present invention is used to polish an object to be polished including a high dielectric constant layer, in which the polishing composition contains an abrasive grain, water, and organic acid, when a zeta potential of the abrasive grain in the polishing composition is set as X [mV], and a zeta potential of the high dielectric constant layer during polishing using the polishing composition is set as Y [mV], X is positive, and Y−X≤−5 is established.

11 Claims, No Drawings

POLISHING COMPOSITION AND POLISHING SYSTEM

CROSS-REFERENCE TO RELATED APPLICATION

This application claims priority to Japanese Patent Application No. 2018-165036 filed on Sep. 4, 2018, the contents of all of which are incorporated herein in their entirety.

BACKGROUND

1. Technical Field

The present invention relates to a polishing composition and a polishing system.

2. Description of Related Arts

In recent years, a so-called chemical mechanical polishing (CMP) technique for polishing and flattening a semiconductor substrate has been used in accordance with multilayer wiring on a surface of a semiconductor substrate. The CMP is a method for flattening a surface of an object to be polished (object to be polished) like a semiconductor substrate by using a polishing composition (slurry) containing abrasive grains such as silica, alumina, or ceria, an anti-corrosion agent, a surfactant, or the like. The object to be polished (target object) is silicon, polysilicon, silicon oxide, silicon nitride, a wiring or a plug which consists of metal, or the like.

A common method of the CMP is performed in such a manner that a polishing pad is attached on a circular polishing table (platen), the surface of the polishing pad is immersed into a polishing agent, the surface of the substrate on which a wiring layer is formed is pressed, the polishing plate is rotated while applying a predetermined pressure (polishing pressure) from the back side, and the wiring layer is removed by mechanical friction between the polishing agent and the wiring layer. For example, in JP 2003-142435 A (corresponding to specification of US 2003/0115806 A) discloses a CMP technique for silicon oxide (TEOS film).

SUMMARY

In recent years, the use of a high dielectric constant material has been studied as a material for forming a semiconductor substrate. In accordance with this, the demand for CMP technique for high dielectric constant materials has been increasing.

Therefore, an object of the present invention is to provide a polishing composition capable of polishing a high dielectric constant layer at a high removal rate.

In order to solve the above new problems, the inventors of the present invention have conducted intensive studies. As a result, it was found that a polishing composition used to polish an object to be polished including a high dielectric constant layer, the polishing composition including an abrasive grain; water; and organic acid, in which when a zeta potential of the abrasive grain in the polishing composition is set as X [mV], and a zeta potential of the high dielectric constant layer during polishing using the polishing composition is set as Y [mV], X is positive, and Y−X≤−5 is established, and the present invention has been completed accordingly.

DETAILED DESCRIPTION

Hereinbelow, the embodiments of the present invention are described. However, the present invention is not limited to the following embodiments. In the present specification, unless otherwise specified, measurements of operations and physical properties are performed under the conditions of room temperature (20° C. or more and 25° C. or less)/relative humidity 40% RH or more and 50% RH or less.

According to an aspect to the present invention, there is provided a polishing composition used to polish an object to be polished including a high dielectric constant layer, the polishing composition containing an abrasive grain, water, and organic acid, in which when a zeta potential of the abrasive grain in the polishing composition is set as X [mV], and a zeta potential of the high dielectric constant layer during polishing using the polishing composition is set as Y [mV], X is positive, and Y−X≤−5 is established. According to the polishing composition, the high dielectric constant layer can be polished at a high removal rate.

When X is positive and Y−X≤−5 is established, at the time of polishing an object to be polished using a polishing composition, electrostatic interaction sufficiently works between the abrasive grains contained in the polishing composition and the high dielectric constant layer in the object to be polished. Therefore, it is considered that the frequency of contact of the abrasive grains with the high dielectric constant layer is increased, and the high dielectric constant layer can be polished at a high removal rate.

Note that, the above mechanism is speculative, and the present invention is not limited to the above mechanism.

<Measurement Method of Zeta Potential>

The zeta potential X [mV] of the abrasive grain in the polishing composition is calculated by putting the polishing composition in ELS-Z2 manufactured by Otsuka Electronics Co., Ltd., to perform a measurement at temperature 25° C. using a flow cell by a laser Doppler method (electrophoretic light scattering measurement method), and then analyzing the obtained data by a Smoluchowski equation.

The zeta potential Y [mV] of the high dielectric constant layer during the polishing using the polishing composition is obtained by putting a silicon wafer on which the high dielectric constant layer is formed in ELS-Z2 manufactured by Otsuka Electronics Co., Ltd., to perform a measurement by the laser Doppler method (electrophoretic light scattering measurement method). Specifically, the silicon wafer on which the high dielectric constant layer is formed is attached on the cell top surface of a flat plate sample cell unit (manufactured by Otsuka Electronics Co., Ltd.) under the condition of a measurement temperature of 25° C. The cell is filled with the polishing composition (abrasive grains whose the zeta potential is known by the above measurement is set as a monitor particle), electrophoresis of the monitor particles is performed, and the mobility of the monitor particles is measured at seven points between the upper and lower surfaces of the cell. The zeta potential Y [mV] is calculated by analyzing the obtained data of electric mobility by a Mori-Okamoto equation and a Smoluchowski equation.

In the present invention, Y−X≤−5 is established. In a case of Y−X>−5, the electrostatic interaction does not work between the abrasive grains contained in the polishing composition and the high dielectric constant layer in the object to be polished. Thus, the frequency of contact of the abrasive grains with the high dielectric constant layer is decreased, and the removal rate of the high dielectric constant layer is lowered.

In the present invention, Y−X≤−13 is preferable, and Y−X≤−16 is more preferable.

A lower limit value of Y−X is not particularly limited, but is preferably, for example, Y−X≥−50, more preferably Y−X≥−40, still more preferably Y−X≥−30, and is particularly preferably Y−X≥−25. The value of Y−X can be controlled to be within a desired range, for example, by adjusting the types and additional amounts of the organic acids described later.

<Object to be Polished>

[High Dielectric Constant Layer]

An object to be polished according to the present invention includes a high dielectric constant layer (a layer containing a high dielectric constant material as a main component). Here, "a layer containing a high dielectric constant material as a main component" means that the content of the high dielectric constant material in the layer is, for example, 50% by mass or more, preferably 80% by mass or more, more preferably 90% by mass or more, still more preferably 95% by mass or more, and particularly preferably 98% by mass or more (upper limit value: 100% by mass).

The high dielectric constant material refers to a material having relative permittivity higher than that of a silicon oxide ($SiO_2$, relative permittivity of 3.9), and more specifically refers to a material having the relative permittivity of 5.0 or higher. The high dielectric constant materials may be used either singly or in combination of two or more types. The relative permittivity is a value obtained by a mercury probe method.

Examples of the materials having the relative permittivity of 5.0 or higher include a metal oxide such as an aluminum oxide ($AlO_X$, relative permittivity of 9 to 10), a magnesium oxide ($MgO_X$, relative permittivity of 9 to 10), a gallium oxide ($GaO_X$, relative permittivity of 9 to 10), a hafnium oxide ($HfO_X$, relative permittivity of 20 to 30), a lanthanum oxide ($LaO_X$, relative permittivity of 20 to 30), a zirconium oxide ($ZrO_X$, relative permittivity of 20 to 30), a cerium oxide ($CeO_X$, relative permittivity of approximately 20), and a titanium oxide ($TiO_X$, relative permittivity of approximately 100). Since the metal oxide satisfies a positive zeta potential at a pH of less than 5.0, the parameter Y can be positive when the high dielectric constant layer contains the metal oxide as a main component. The metal oxides may be used either singly or in combination of two or more types.

The metal oxide may be either crystalline or amorphous, but is preferably amorphous from the viewpoint of suppressing the generation of a leak current due to a crystal grain boundary. Therefore, in a preferred embodiment of the present invention, the high dielectric constant layer contains an amorphous metal oxide. Note that "the high dielectric constant layer contains an amorphous metal oxide" means that a half width of the maximum peak derived from a crystal structure of the metal oxide in an X-ray diffraction image of the high dielectric constant layer containing the metal oxide is 1° or higher.

Meanwhile, the X-ray diffraction image can be obtained by the following apparatus and conditions:

X-ray diffractometer: manufactured by Rigaku Corporation
  Model: SmartLab
  Measurement method: XRD method (2θ/ω scan)
  X-ray generator: Anticathode Cu
  Output: 45 kV 200 mA
  Detector: Semiconductor detector
  Incident optical system: Parallel beam method (Scot collimation)
    Solar slit: Incident side 5.0°
    Light receiving side: 5.0°
    Slit: Incident side IS=1 (mm)
    Longitudinal limit: 5 (mm)
    Light receiving side: RS1=1, RS2=1.1 (mm)
  Scanning condition: Scanning axis 2θ/ω
  Scan mode: Continuous scan
  Scanning range: 20° to 90°
  Step width: 0.02°
  Scanning speed: 2°/min The high dielectric constant layer can be formed by a known method such as a vapor deposition method, a sputtering method, a plasma CVD method, and a sol-gel method, and the like.

[Low Dielectric Constant Layer]

The object to be polished according to the present invention may further include a low dielectric constant layer (a layer containing a low dielectric constant material as a main component) in addition to the high dielectric constant layer. Here, "a layer containing a low dielectric constant material as a main component" means that the content of the low dielectric constant material is, for example, 50% by mass or more, preferably 80% by mass or more, more preferably 90% by mass or more, still more preferably 95% by mass or more, and particularly preferably 98% by mass or more (upper limit value: 100% by mass).

The low dielectric constant material refers to a silicon oxide ($SiO_2$, relative permittivity of 3.9), and a material having relative permittivity lower than that the silicon oxide (specifically, a material having relative permittivity of 3.5 or lower). Examples of the material having the relative permittivity of 3.5 or lower include a carbon-containing silicon oxide (SiOC) and a fluorine-containing silicon oxide (SiOF). The low dielectric constant materials may be used either singly or in combination of two or more types.

The low dielectric constant layer can be formed, for example, using TEOS (tetraethoxysilane) or the like as a starting material by a known method such as a CVD method (chemical vapor deposition method).

<Polishing Composition>

[Abrasive Grain]

The abrasive grain used for the polishing composition of the present invention exhibits a positive zeta potential in the polishing composition. As such an abrasive grain, silica having a cationic group is preferable. In addition, as silica, colloidal silica is preferable. That is, the abrasive grain used in the present invention is preferably colloidal silica (cation-modified colloidal silica) having a cationic group.

Here, colloidal silica may be produced, for example, by a sol-gel method. The colloidal silica produced by the sol-gel method is preferable because the content of corrosive ions such as diffusive metal impurities and chloride ions in a semiconductor is small. The production of the colloidal silica by the sol-gel method can be performed using a known method in the related art, and specifically, the colloidal silica can be obtained by performing hydrolysis and condensation reaction using a hydrolyzable silicon compound (for example, alkoxysilane or a derivative thereof) as a raw material.

Preferred examples of the colloidal silica having a cationic group include colloidal silica in which an amino group or a quaternary ammonium group is immobilized on the surface. Examples of a method of producing colloidal silica having such a cationic group include, as disclosed in JP 2005-162533 A, a method for immobilizing a silane coupling agent having an amino group such as aminoethyl trimethoxysilane, aminopropyl trimethoxysilane, aminoethyl triethoxysilane, aminopropyl triethoxysilane, aminopropyl dimethyl ethoxysilane, aminopropyl methyl diethoxysilane, and aminobutyl triethoxysilane, or a silane coupling agent having a quaternary ammonium group such as N-trimethoxysilyl propyl-N,N,N-trimethyl ammonium on the surface of the abrasive grain. With this, it is possible to obtain colloidal silica in which an amino group or a quaternary ammonium group is immobilized on the surface.

A shape of the abrasive grain is not particularly limited, and may be a spherical shape or a non-spherical shape. Specific examples of the non-spherical shape include various shapes of a polygonal column shape such as a triangular column and a square column, a column shape, a pillow shape in which the center of a column bulges more than ends, a donut shape having a hole at the center of a disc, a plate shape, a so-called silk cocoon shape having a constriction at the center, a so-called associated sphere shape in which a plurality of particles are integrated, a so-called Kompeito shape having a plurality of projections on the surface, and the like.

A size of the abrasive grain is not particularly limited, but a lower limit of an average primary particle size of the abrasive grains is preferably 5 nm or more, more preferably 7 nm or more, and still more preferably 10 nm or more, and particularly preferably 25 nm or more. In addition, in the polishing composition of the present invention, the upper limit of the average primary particle size of the abrasive grains is preferably 120 nm or less, more preferably 80 nm or less, and still more preferably 50 nm or less. Within such a range, defects such as scratches can be suppressed on the surface of the object to be polished after polishing using the polishing composition. The average primary particle size of the abrasive grains is calculated based on, for example, the specific surface area of the abrasive grain measured by a BET method.

In the polishing composition of the present invention, the lower limit of an average secondary particle size of the abrasive grains is preferably 10 nm or more, more preferably 20 nm or more, still more preferably 30 nm or more, and particularly preferably 50 nm or more. In addition, in the polishing composition of the present invention, the upper limit of the average secondary particle size of the abrasive grains is preferably 250 nm or less, more preferably 200 nm or less, still more preferably 150 nm or less, and particularly preferably 100 nm or less. Within such a range, defects such as scratches can be suppressed on the surface of the object to be polished after polishing using the polishing composition. Note that, the average secondary particle size of the abrasive grains can be measured, for example, by a dynamic light scattering method represented by a laser diffraction scattering method.

An average association degree of the abrasive grains is preferably 5.0 or lower, more preferably 3.0 or lower, and still more preferably 2.5 or lower. As the average association degree of the abrasive grains is decreased, the generation of defects on the surface of the object to be polished can be further reduced. In addition, the average association degree of the abrasive grains is preferably 1.0 or higher, and is more preferably 1.2 or higher. As the average association degree of the abrasive grains is increased, there is an advantage in that the removal rate by the polishing composition is improved. Note that, the average association degree of the abrasive grains can be obtained by dividing the value of the average secondary particle size of the abrasive grains by the value of the average primary particle size.

The upper limit of an aspect ratio of the abrasive grain is not particularly limited, but is preferably lower than 2.0, more preferably 1.8 or lower, and still more preferably 1.5 or lower. In such a range, it is possible further reduce the defects on the surface of the object to be polished. The aspect ratio is an average value obtained by taking the smallest rectangle circumscribing the image of an abrasive particle with a scanning electron microscope and dividing the length of a long side of the rectangle by the length of a short side of the same rectangle, and can be determined using general image analysis software. The lower limit of the aspect ratio of the abrasive grain is not particularly limited, but is preferably 1.0 or higher.

In a particle size distribution of the abrasive grain, which is obtained by the laser diffraction scattering method, the lower limit of D90/D10 which is a ratio of a particle diameter (D90) when the accumulated particle weight reaches 90% of total particle weight from the particle side to a particle diameter (D10) when the accumulated particle weight reaches 10% of total particle weight from the particle side is not particularly limited, and it is preferably 1.1 or more, more preferably 1.2 or more, and still more preferably 1.3 or more. In the particle size distribution of the abrasive grain in the polishing composition, which is obtained by the laser diffraction scattering method, the upper limit of D90/D10 which is a ratio of a particle diameter (D90) when the accumulated particle weight reaches 90% of total particle weight from the particle side to a particle diameter (D10) when the accumulated particle weight reaches 10% of total particle weight from the particle side is not particularly limited, and it is preferably 2.04 or less. In such a range, it is possible further reduce the defects on the surface of the object to be polished.

The size of the abrasive grain (average primary particle size, average secondary particle size, aspect ratio, D90/D10, and the like) can be appropriately controlled by the selection and the like of the method for producing the abrasive grains.

A lower limit of the content (concentration) of the abrasive grain in the polishing composition of the present invention is preferably 0.01% by mass or more, more preferably 0.05% by mass or more, and is still more preferably 0.1% by mass or more. In addition, a limit of the content (concentration) of the abrasive grain in the polishing composition of the present invention is preferably 20% by mass or less, more preferably 10% by mass or less, still more preferably 5% by mass or less, further still more preferably 1% by mass or less, and particularly preferably 0.8% by mass or less. When the upper limit is as such, generation of surface defects on the surface of the object to be polished after polishing using the polishing composition can be further suppressed. Note that, in a case where the polishing composition contains two or more types of abrasive grains, the content of the abrasive grains is intended to be the total amount of these.

[Water]

The polishing composition according to the present invention contains water as a dispersing medium or a solvent. It is preferable that water does not contain impurities as much as possible from the viewpoint of suppressing the contamination of the object to be polished and the viewpoint of not inhibiting actions of other components. As such water, for example, water having a total content of transition metal ions of 100 ppb or less is preferable. Here, the purity of water can be increased by operations of removal of impurity ions using an ion exchange resin, removal of foreign matters through a filter, distillation, and the like. Specifically, as water, for example, deionized water (ion-exchanged water), pure water, ultrapure water, distilled water, or the like is preferably used.

[Organic Acid]

The polishing composition of the present invention contains organic acid. The organic acid lowers the zeta potential of the high dielectric constant layer so that Y−X has a value of −5 or less, thereby improving the removal rate of the high dielectric constant layer.

The type of the organic acid for establishing Y−X≤−5 is not particularly limited, but is preferably at least one type selected from the group consisting of a compound represented by the following Chemical Formula (1) and a compound satisfying the following Structure (2).

[Chem. 1]

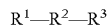
$$R^1-R^2-R^3 \quad \text{Chemical Formula (1)}$$

(in the above Chemical Formula (1), $R^1$ and $R^3$ are each independently an acid group, and $R^2$ is a single bond or a substituted or unsubstituted methylene group.)

Structure (2)

Compound having at least one acid group in the molecule, and three or more of the acid group and the hydroxy group in the molecule in total Examples of the acid group represented by $R^1$ and $R^3$ in the above Chemical Formula (1) and the acid group in the above Structure (2) include a carboxylic acid group (carboxy group), a phosphonic acid group, a phosphoric acid group, and a sulfonic acid group (sulfo group). In the present specification, a term "acid group" refers not only to a free acid group but also to a group in the form of a salt. Here, the acid group is preferably a free acid group from the viewpoint of increasing the absolute value of Y−X and improving the removal rate of the high dielectric constant layer.

Further, among the acid groups, from the viewpoint the zeta potential of the high dielectric constant layer can be easily lowered and the removal rate of the high dielectric constant layer can be easily improved, the acid group is preferably at least one selected from the group consisting of a carboxylic acid group, a phosphonic acid group, and a sulfonic acid group, and from the viewpoint of improving the stability of the polishing composition, a carboxylic acid group is more preferable.

The methylene group represented by $R^2$ in the above Chemical Formula (1) may be substituted. Example of the substituent include a nitro group, a halogen atom, a carboxylic acid group, a phosphonic acid group, a phosphate group, a sulfonic acid group, a hydroxy group, a cyano group, an amino group, an alkyl group (preferably 1 to 20 carbon atoms), a hydroxyalkyl group (preferably 1 to 20 carbon atoms), a carboxyalkyl group (preferably 2 to 20 carbon atoms), an alkoxy group (preferably 1 to 20 carbon atoms), a cycloalkyl group (preferably 3 to 20 carbon atoms), an alkenyl group (preferably 2 to 20 carbon atoms), an aryl group (preferably 6 to 20 carbon atoms), an alkoxycarbonyl group (preferably 2 to 20 carbon atoms), an acyl group (preferably 2 to 20 carbon atoms), an alkoxycarbonyloxy group (preferably 2 to 20 carbon atoms), an arylthio group (preferably 6 to 15 carbon atoms), a hydroxyalkyl group (preferably 1 to 20 carbon atoms), an alkyl carbonyl group (preferably 2 to 20 carbon atoms), a cycloalkyl carbonyl group (preferably 5 to 20 carbon atoms), and an aryl carbonyl group (preferably 7 to 20 carbon atoms).

The above Structure (2) refers to a structure having, in an organic acid, at least one acid group in the molecule, and three or more of the acid group and the hydroxy group in the molecule in total. The compound satisfying the Structure (2) does not necessarily have a hydroxy group, and for example, a compound having three or more acid groups and no hydroxyl group is included in the compound satisfying the Structure (2).

In the above Chemical Formula (1), $R^2$ is a methylene group, and in a case where the methylene group is a compound having, as a substituent, a carboxylic acid group, a phosphonic acid group, a phosphate group, a sulfonic acid group, a hydroxy group, a hydroxyalkyl group, or a carboxyalkyl group, the compound corresponds to the compound represented by the above Chemical Formula (1), and also corresponds to the "compound having at least one acid group in the molecule, and three or more of the acid group and the hydroxy group in the molecule in total" of the above Structure (2).

More specific examples of the organic acid are as follows. Specific examples of the compound represented by the above Chemical Formula (1) include oxalic acid, malonic acid, methylmalonic acid, methylethylmalonic acid, ethylmalonic acid, propylmalonic acid, methylpropylmalonic acid, butylmalonic acid, methylbutylmalonic acid, pentylmalonic acid, hexylmalonic acid, dimethylmalonic acid, diethylmalonic acid, dipropylmalonic acid, dibutylmalonic acid, phenylmalonic acid, 2-hydroxymalonic acid (tartronic acid, also applies to Structure (2)), 1,1,3-propanetricarboxylic acid (also applies to Structure (2)), methylenediphosphonic acid, 1-hydroxyethane-1,1-diphosphonic acid (etidronic acid, also applies to Structure (2)), and methanedisulfonic acid, 1-hydroxyethane-1,1-disulfonic acid (also applies to Structure (2)).

Specific examples of the compound corresponding to the above Structure (2) include cis-aconitic acid, trans-aconitic acid, citric acid, isocitric acid, tartaric acid, metatartaric acid, dihydroxytartaric acid, gluconic acid, glyceric acid, glucuronic acid, malic acid, citramalic acid, 2,2-bis(hydroxymethyl) propionic acid, 2-hydroxy-2-methyl succinic acid, galactaric acid, 1,2,3-propanetricarboxylic acid, 3-hydroxy-3,4-dicarboxypentadecanoic acid, 2-hydroxy-1,2,3-nonadecanetricarboxylic acid, 1,6,11-pentadecanetricarboxylic acid, 1,10,11-pentatricarboxylic acid, 5,6,11-pentadecanetricarboxylic acid, 1,2,3,4-butanetetracarboxylic acid, ethylenediaminetetraacetic acid, 3-hydroxyaspartic acid, hydroxyglutamic acid, nitrilotris(methylenephosphonic acid), and hexamethylenebis(nitrilo)tetraphosphonic acid.

These organic acids may be used either singly or in combination of two or more types. Also, these organic acids may be synthetic products or commercial products.

The organic acid preferably has no amino group. The reason is that the amino group is less effective in lowering the zeta potential of the high dielectric constant layer. From such a viewpoint and a viewpoint of easily increasing the removal rate of the high dielectric constant layer, the organic acid is preferably malonic acid, methylmalonic acid, methylethylmalonic acid, ethylmalonic acid, propylmalonic acid, methylpropylmalonic acid, butylmalonic acid, dimethylmalonic acid, diethylmalonic acid, dipropylmalonic acid, dibutylmalonic acid, 2-hydroxymalonic acid (tartronic acid), 1-hydroxyethane-1,1-diphosphonic acid (etidronic acid), methanedisulfonic acid, trans-aconitic acid, citric acid, isocitric acid, tartaric acid, metatartaric acid, dihydroxytartaric acid, malic acid, galactaric acid, and 1,2,3,4-butanetetracarboxylic acid, more preferably malonic acid, methylmalonic acid, 2-hydroxymalonic acid (tartronic acid), 1-hydroxyethane-1,1-diphosphonic acid (etidronic acid), methanedisulfonic acid, trans-aconitic acid, tartaric acid, malic acid, galactaric acid, and 1,2,3,4-butanetetracarboxylic acid, still more preferably malonic acid, methylmalonic acid, 2-hydroxymalonic acid (tartronic acid), 1-hydroxyethane-1,1-diphosphonic acid (etidronic acid), trans-aconitic acid, tartaric acid, galactaric acid, and 1,2,3,4-butanetetracarboxylic acid, and particularly preferably malonic acid, methylmalonic acid, 2-hydroxymalonic acid (tartronic acid), transaconitic acid, tartaric acid, galactaric acid.

The organic acid also functions as a pH adjusting agent in the polishing composition of the present invention. Therefore, the content (concentration) of the organic acid in the polishing composition of the present invention may be appropriately selected such that the polishing composition has a desired pH. If it is in the range of such content (concentration), the effect of improving the removal rate of the high dielectric constant layer can be efficiently exhibited.

[pH of Polishing Composition]

The pH of the polishing composition of the present invention is not particularly limited. However, from the viewpoint of further improving the removal rate of the high dielectric constant layer, it is preferably less than 5.0. Within this range, the zeta potential of the high dielectric constant layer is lowered, and the absolute value of the zeta potential difference (that is, Y−X) with the abrasive grain is increased, so that the removal rate of the high dielectric constant layer is further improved. On the other hand, the lower limit of the pH of the polishing composition is preferably 2.0 or more, more preferably 3.0 or more, and particularly preferably 4.0 or more. If the pH is the lower limit or higher, in a case where and the object to be polished includes a low dielectric constant layer, the removal rate of the low dielectric constant layer can be improved while maintaining the removal rate of the high dielectric constant layer. As a result, the selectivity of the high dielectric constant layer to the low dielectric constant layer can be reduced. Therefore, it can be advantageous in the simultaneous polishing of the high dielectric constant layer and the low dielectric constant layer.

Meanwhile, the pH of the polishing composition can be grasped by calibrating at 3 points using a standard buffer solution (phthalate pH buffer solution, pH: 4.01 (25° C.), neutral phosphate pH buffer solution, pH: 6.86 (25° C.), and carbonate pH buffer solution, pH: 10.01 (25° C.)) with a pH meter (for example, a glass electrode type hydrogen ion concentration indicator manufactured by Horiba, Ltd. (model number: F-23)), then putting a glass electrode to the polishing composition, and measuring a value after the mixture has become stable after more than two minutes.

The pH of the polishing composition according to the present invention can be adjusted by the addition of the above-described organic acid, but if necessary, an appropriate amount of a pH adjusting agent may be added. The pH adjusting agent may be any of acid and alkali, and may be any of an inorganic compound and an organic compound. The pH adjusting agents may be used either singly or in combination of two or more types.

(pH Adjusting Agent)

As a pH adjusting agent, known acids or bases can be used.

Examples of the acids other than the above-described organic acids that can be used as a pH adjusting agent include inorganic acids such as sulfuric acid, nitric acid, boric acid, carbonic acid, hypophosphorous acid, phosphorous acid, and phosphoric acid; carboxylic acids, such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glutaric acid, adipic acid, pimelic acid, maleic acid, phthalic acid, and lactic acid; and organic sulfonic acids such as ethanesulfonic acid and isethionic acid.

Examples of a base which can be used as a pH adjusting agent include hydroxides or salts of alkali metals, hydroxides or salts of Group 2 elements, quaternary ammonium hydroxides or salts thereof, ammonia, and amines. Specific examples of the alkali metal include potassium and sodium.

The addition amount of the pH adjusting agent is not particularly limited, and may be appropriately selected so that the pH of the polishing composition of the present invention is within a desired range.

[Other Additives]

The polishing composition of the present invention may further include known complexing agents, a metal anticorrosive, an antiseptic agent, an antifungal agent, a reducing agent, a nonionic surfactant, a water-soluble polymer, an organic solvent for dissolving insoluble organic substance, within the range not impairing the effects of the present invention.

However, in a case where the high dielectric constant layer is a layer containing an amorphous metal oxide as a main component, the removal rate of the high dielectric constant layer may be decreased when polishing with the polishing composition containing an oxidizing agent. Accordingly, it is preferable that the polishing composition of the present invention contains substantially no oxidizing agent. That is, in one preferable embodiment of the present invention, the high dielectric constant layer contains an amorphous metal oxide, and the polishing composition contains substantially no oxidizing agent. Specific examples of the oxidizing agent referred to herein include hydrogen peroxide ($H_2O_2$), sodium persulfate, ammonium persulfate, and sodium dichloroisocyanurate. Here, "the polishing composition contains substantially no oxidizing agent" means that it does not at least intentionally contain an oxidizing agent. Therefore, the polishing composition derived from a raw material, a production method, and the like, and unavoidably containing a trace amount of the oxidizing agent can be included in the concept of a polishing composition having substantially no oxidizing agent. For example, a molar concentration of the oxidizing agent in the polishing composition is 0.005 mol/L or lower, preferably 0.001 mol/L or lower, and more preferably 0.0005 mol/L or lower.

<Method for Producing Polishing Composition>

The method for producing the polishing composition of the present invention is not particularly limited, and for example, the polishing composition can be obtained by stirring and mixing abrasive grains, organic acid, and if necessary, other additives in water. The details of each component are as described above. Accordingly, the present invention provides a method for producing a polishing composition used to polish an object to be polished including a high dielectric constant layer, the method including mixing an abrasive grain, water, and organic acid, in which when a zeta potential of the abrasive grain in the polishing composition is set as X [mV], and a zeta potential of the high dielectric constant layer during polishing using the polishing composition is set as Y [mV], X is positive, and Y−X≤−5 is established.

The temperature at which each component is mixed is not particularly limited, and is preferably 10° C. or more and 40° C. or less, and heating may be performed to increase a rate of dissolution. In addition, a mixing time is also not particularly limited as long as uniform mixing is possible.

<Polishing Method and Producing Method of Semiconductor Substrate>

As described above, the polishing composition of the present invention is suitably used for polishing an object to be polished including a high dielectric constant layer. Therefore, the present invention provides a polishing method including a step of preparing an object to be polished including a high dielectric constant layer; and a step of polishing the object to be polished using the polishing composition. In addition, the present invention also provides a method for producing a semiconductor substrate, including a step of polishing an object to be polished including a high dielectric constant layer by the above polishing method.

As a polishing apparatus, it is possible to use a general polishing apparatus to which a holder for holding a substrate or the like having an object to be polished and a motor or the like capable of changing the rotation speed are attached, and which includes a polishing table to which a polishing pad (polishing cloth) can be attached.

As the polishing pad, general non-woven fabric, polyurethane, porous fluororesin and the like can be used without particular limitation. It is preferable that the polishing pad is subjected to groove processing so that a polishing solution is accumulated.

Regarding the polishing conditions, for example, the rotation speed of the polishing table is preferably 10 rpm (0.17 s$^{-1}$) or more and 500 rpm (8.3 s$^{-1}$) or less. The pressure (polishing pressure) applied to the substrate having the object to be polished is preferably 0.5 psi (3.4 kPa) or more and 10 psi (68.9 kPa) or less. The method for supplying the polishing composition to the polishing pad is not particularly limited, and for example, a method for continuously supplying the composition with a pump or the like is employed. The amount supplied is not particularly limited, the surface of the polishing pad is preferably covered with the polishing composition of the present invention all the time.

After completion of the polishing, the substrate is washed in flowing water, and water droplets adhering to the substrate are removed by a spin dryer or the like to dry the substrate, thereby obtaining a substrate having a metal-containing layer.

The polishing composition of the present invention may be a one-component type or a multi-component type including a two-component type. In addition, the polishing composition of the present invention may be prepared by diluting, for example, 10 times or more of the stock solution of the polishing composition with a diluent such as water.

<Polishing System>

The present invention provides a polishing system including: an object to be polished including a high dielectric constant layer; a polishing pad; and a polishing composition, the polishing composition containing an abrasive grain, water, and organic acid, in which when a zeta potential of the abrasive grain in the polishing composition is set as X [mV], and a zeta potential of the high dielectric constant layer during polishing using the polishing composition is set as Y [mV], X is positive, and Y−X≤−5 is established, and a surface of the object to be polished is brought into contact with the polishing pad and the polishing composition.

The object to be polished and the polishing composition applied to the polishing system of the present invention are the same as described above, and thus the description thereof is omitted here.

The polishing pad used in the polishing system of the present invention is not particularly limited, and for example, a polyurethane type, a non-woven type, a suede type, one containing an abrasive grain, one not containing an abrasive grain, and the like can be used.

In the polishing system of the present invention, both surfaces of the object to be polished may be simultaneously polished by bringing both surfaces of the object to be polished into contact with the polishing pad and the polishing composition, or only one surface of the object to be polished may be polished by bringing only one surface the object to be polished into contact with the polishing pad and the polishing composition.

In the polishing system of the present invention, a working slurry containing the above-described polishing composition is prepared. Then, the polishing composition is supplied to the object to be polished and polished by a conventional method. For example, the object to be polished is set in a general polishing apparatus, and the polishing composition is supplied to the surface (surface to be polished) of the object to be polished through the polishing pad of the polishing apparatus. Typically, while continuously supplying the above-described polishing composition, the polishing pad is pressed against the surface of the object to be polished and both are moved (for example, rotationally moved) relative to each other. The polishing of the object to be polished is completed through this polishing step.

Regarding the polishing conditions, for example, the rotation speed of the polishing table is preferably 10 rpm (0.17 s$^{-1}$) or more and 500 rpm (8.3 s$^{-1}$) or less. The pressure (polishing pressure) applied to the substrate having the object to be polished is preferably 0.5 psi (3.4 kPa) or more and 10 psi (68.9 kPa) or less. The method for supplying the polishing composition to the polishing pad is not particularly limited, and for example, a method for continuously supplying the composition with a pump or the like is employed. The amount supplied is not particularly limited, the surface of the polishing pad is preferably covered with the polishing composition of the present invention all the time.

Although the embodiments of the present invention have been described in detail, note that this is illustrative and exemplary, and not limiting, and the scope of the present invention is to be interpreted by the appended claims.

The present invention includes the following aspects and embodiments.

1. A polishing composition used to polish an object to be polished including a high dielectric constant layer, the polishing composition including:
    an abrasive grain; water; and organic acid, in which when a zeta potential of the abrasive grain in the polishing composition is set as X [mV], and a zeta potential of the high dielectric constant layer during polishing using the polishing composition is set as Y [mV], X is positive, and Y−X≤−5 is established.

2. The polishing composition according to the above-described 1, in which the organic acid is at least one selected from the group consisting of a compound represented by the following Chemical Formula (1) and a compound satisfying the following Structure (2).

[Chem. 2]

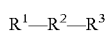　　　　　　　　　　　　　　Chemical Formula (1)

(in the above Chemical Formula (1), R$^1$ and R$^3$ are each independently an acid group, and R$^2$ is a single bond or a substituted or unsubstituted methylene group.)

Structure (2)

Having at least one acid group in the molecule, and three or more of the acid group and the hydroxy group in the molecule in total 3. The polishing composition according to the above-described 2, in which the acid group is at least one selected from the group consisting of a carboxylic acid group, a phosphonic acid group, and a sulfonic acid group.

4. The polishing composition according to the above-described 2 or 3, in which the acid group is a carboxylic acid group.

5. The polishing composition according to any one of the above-described 1 to 4, in which the high dielectric constant layer includes an amorphous metal oxide.

6. A method for producing a polishing composition used to polish an object to be polished including a high dielectric constant layer, the method including mixing an abrasive grain, water, and organic acid, in which when a zeta potential of the abrasive grain in the polishing composition is set as X [mV], and a zeta potential of the high dielectric constant layer during polishing using the polishing composition is set as Y [mV], X is positive, and Y−X≤−5 is established.

7. A polishing method including:

a step of preparing an object to be polished including a high dielectric constant layer; and a step of polishing the object to be polished using the polishing composition according to any one of the above-described 1 to 5.

8. A method for producing a semiconductor substrate, including a step of polishing a semiconductor substrate including a high dielectric constant layer by the polishing method according to the above-described 7.

9. A polishing system including: an object to be polished including a high dielectric constant layer; a polishing pad; and a polishing composition, the polishing composition containing an abrasive grain, water, and organic acid, in which when a zeta potential of the abrasive grain in the polishing composition is set as X [mV], and a zeta potential of the high dielectric constant layer during polishing using the polishing composition is set as Y [mV], X is positive, and Y−X≤−5 is established, and a surface of the object to be polished is brought into contact with the polishing pad and the polishing composition.

10. The polishing system according to the above-described 9, in which the organic acid is at least one selected from the group consisting of a compound represented by the following Chemical Formula (1) and a compound satisfying the following Structure (2).

[Chem. 3]

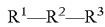   Chemical Formula (1)

(in the above Chemical Formula (1), $R^1$ and $R^3$ are each independently an acid group, and $R^2$ is a single bond or a substituted or unsubstituted methylene group.)

Structure (2)

Having at least one acid group in the molecule, and three or more of the acid group and the hydroxy group in the molecule in total 11. The polishing system according to the above-described 9 or 10, in which the high dielectric constant layer includes an amorphous metal oxide.

EXAMPLES

The present invention will be further described in detail using the following examples and comparative examples. Here, the technical scope of the present invention is not limited to the following examples. In addition, unless otherwise specified, "%" and "parts" mean "% by mass" and "parts by mass", respectively. Further, in the following examples, unless otherwise specified, the operation was performed under the conditions of room temperature (20° C. or more and 25° C. or less)/relative humidity 40% RH or more and 50% RH or less.

Preparation of Polishing Composition

Example 1

As an abrasive grain, cation-modified colloidal silica in which an amino group is immobilized on the surface (average primary particle size of 35 nm, average secondary particle size of 70 nm, average association degree of 2.0) was added to water so as to have a concentration of 0.5% by mass with respect to 100% by mass of the total mass of the polishing composition. In addition, 1,2,3,4-butanetetracarboxylic acid was added to the mixture of the abrasive grain and water in such an amount that a pH of the polishing composition was 4.5. Thereafter, the mixture was stirred and mixed at room temperature (25° C.) for 30 minutes to prepare a polishing composition.

The average primary particle size of the abrasive grains was calculated from the specific surface area of the abrasive grains measured by a BET method using "Flow Sorb II 2300" manufactured by Micromeritics and the density of the abrasive grains. Further, the average secondary particle size of the abrasive grains was measured by a dynamic light scattering particle diameter and particle size distribution device UPA-UTI 151 manufactured by Nikkiso Co., Ltd. Furthermore, the pH of the polishing composition (liquid temperature: 25° C.) was confirmed with a pH meter (model: LAQUA manufactured by Horiba, Ltd.).

Examples 2 to 12 and Comparative Examples 1 to 16

Each polishing composition was prepared in the same manner as in Example 1 except that the type of the organic acid or the inorganic acid was changed as indicated in Table 1 below.

<Measurement of Zeta Potential of Abrasive Grain>

Each polishing composition prepared above was put in ELS-Z2 manufactured by Otsuka Electronics Co., Ltd., to perform a measurement at temperature 25° C. using a flow cell by a laser Doppler method (electrophoretic light scattering measurement method). The zeta potential X [mV] of the cation-modified colloidal silica in each polishing composition was calculated by analyzing the obtained data by the Smoluchowski equation.

<Measurement of Zeta Potential of High Dielectric Constant Layer>

The zeta potential Y [mV] of the high dielectric constant layer during polishing using the polishing composition was measured as follows. Regarding a silicon wafer (a 300 mm wafer is cut into 15×35 mm) on which an amorphous metal oxide ($AlO_x$) film is formed with a thickness of 1000 Å as a high dielectric constant layer, measurement was performed by a laser Doppler method (electrophoretic light scattering measurement method) using ELS-Z2 manufactured by Otsuka Electronics Co., Ltd. Specifically, the silicon wafer was attached on the cell top surface of a flat plate sample cell unit (manufactured by Otsuka Electronics Co., Ltd.) under the condition of a measurement temperature of 25° C. The cell was filled with each polishing composition (sulfonic acid fixed colloidal silica whose the zeta potential is known by the above measurement is set as a monitor particle) prepared above, electrophoresis of the monitor particles was performed, and the mobility of the monitor particles was measured at seven points between the upper and lower surfaces of the cell. The zeta potential Y [mV] was calculated by analyzing the obtained data of electric mobility by a Mori-Okamoto equation and a Smoluchowski equation.

The film thickness was obtained by a light interference type film thickness measurement apparatus (manufactured by KLA-Tencor Co., Ltd., model number: ASET-f5x), and the removal rate was evaluated by dividing the difference in film thickness before and after polishing by the polishing time. The results are shown in Table 1.

TABLE 1

|  | Abrasive grain Content (% by mass) | Organic acid Types | pH | X (mV) | Y (mV) | Y − X (mV) | Removal rate (Å/min) |
|---|---|---|---|---|---|---|---|
| Example 1 | 0.5 | 1,2,3,4-butanetetracarboxylic acid | 4.5 | +20 | +3.4 | −16.6 | 1698 |
| Example 2 | 0.5 | trans-aconitic acid | 4.5 | +20 | −0.5 | −20.5 | 1914 |
| Example 3 | 0.5 | Citric acid | 4.5 | +20 | +7.2 | −12.8 | 1031 |
| Example 4 | 0.5 | Galactaric acid | 4.5 | +20 | +2.1 | −17.9 | 2083 |
| Example 5 | 0.5 | Tartaric acid | 4.5 | +20 | +0.1 | −19.9 | 1894 |
| Example 6 | 0.5 | Malic acid | 4.5 | +20 | +12.0 | −8.0 | 797 |
| Example 7 | 0.5 | Malonic acid | 4.5 | +20 | +3.5 | −16.5 | 2037 |
| Example 8 | 0.5 | Methylmalonic acid | 4.5 | +20 | −0.8 | −20.8 | 2590 |
| Example 9 | 0.5 | Tartronic acid | 4.5 | +20 | −3.8 | −23.8 | 2845 |
| Example 10 | 0.5 | 3-hydroxyaspartic acid | 4.5 | +20 | +4.2 | −15.8 | 1368 |
| Example 11 | 0.5 | Methanedisulfonic acid | 4.5 | +20 | +4.8 | −15.2 | 1325 |
| Example 12 | 0.5 | Etidronic acid | 4.5 | +20 | +3.6 | −16.4 | 1624 |
| Comparative Example 1 | 0.5 | Phthalic acid | 4.5 | +20 | +19.1 | −0.9 | 330 |
| Comparative Example 2 | 0.5 | Maleic acid | 4.5 | +20 | +19.5 | −0.5 | 349 |
| Comparative Example 3 | 0.5 | Citraconic acid | 4.5 | +20 | +19.5 | −0.5 | 68 |
| Comparative Example 4 | 0.5 | Succinic acid | 4.5 | +20 | +19.5 | −0.5 | 137 |
| Comparative Example 5 | 0.5 | Glutaric acid | 4.5 | +20 | +19.4 | −0.6 | 130 |
| Comparative Example 6 | 0.5 | Adipic acid | 4.5 | +20 | +19.1 | −0.9 | 152 |
| Comparative Example 7 | 0.5 | Pyruvic acid | 4.5 | +20 | +19.5 | −0.5 | 297 |
| Comparative Example 8 | 0.5 | Acetic acid | 4.5 | +20 | +19.5 | −0.5 | 175 |
| Comparative Example 9 | 0.5 | 2-hydroxyisobutyric acid | 4.5 | +20 | +19.7 | −0.3 | 232 |
| Comparative Example 10 | 0.5 | Lactic acid | 4.5 | +20 | +19.2 | −0.8 | 237 |
| Comparative Example 11 | 0.5 | Glycolic acid | 4.5 | +20 | +19.2 | −0.8 | 291 |
| Comparative Example 12 | 0.5 | Aspartic acid | 4.5 | +20 | +17.2 | −2.8 | 365 |
| Comparative Example 13 | 0.5 | Glutamic acid | 4.5 | +20 | +19.3 | −0.7 | 131 |
| Comparative Example 14 | 0.5 | Methanesulfonic acid | 4.5 | +20 | +19.5 | −0.5 | 155 |
| Comparative Example 15 | 0.5 | Phenylphosphonic acid | 4.5 | +20 | +19.9 | −0.1 | 216 |
| Comparative Example 16 | 0.5 | Nitric acid | 4.5 | +20 | +19.4 | −0.6 | 189 |

The values of X, Y and Y−X obtained using each polishing composition are indicated in Table 1.

<Polishing Performance Evaluation>

A silicon wafer (a 300 mm wafer is cut into 60×60 mm) on which an amorphous metal oxide ($AlO_X$) film is formed with a thickness of 1000 Å as a high dielectric constant layer was prepared, and each wafer was polished under the following polishing conditions using the polishing composition obtained above, and the removal rate was measured.

(Polishing Conditions)
Polishing machine: tabletop polishing machine
Polishing pad: IC1010 pad (made by Dow Chemical)
Pressure: 1.4 psi (1 psi=6894.76 Pa)
Platen (table) rotation speed: 60 rpm
Head (carrier) rotation speed: 60 rpm
Flow rate of polishing composition: 100 ml/min
Polishing time: 15 sec (Removal Rate)
The Removal rate (RR) was calculated by the following equation. Note that, 1 Å=0.1 nm is established.

$$\text{Removal rate [Å/min]} = \frac{\text{Film thickness before polishing [Å]} - \text{Film thickness after polishing [Å]}}{\text{Polishing time [min]}} \quad \text{[Equation 1]}$$

As apparent from Table 1 above, in a case where the polishing composition for polishing of the examples containing the organic acid satisfying Y−X≤−5 was used, the removal rate of the object to be polished including a high dielectric constant layer was increased as compared with the polishing composition of the comparative example.

What is claimed is:

1. A polishing composition used to polish an object to be polished including a high dielectric constant layer, the polishing composition comprising:
   an abrasive grain, wherein the abrasive grain is colloidal silica in which a silane coupling agent having an amino group or a silane coupling agent having a quaternary amino group is immobilized on the surface;
   water; and
   an organic acid,
   wherein when a zeta potential of the abrasive grain in the polishing composition is set as X [mV], and a zeta potential of the high dielectric constant layer during polishing using the polishing composition is set as Y [mV], X is positive, and Y−X≤−5 is established.

2. The polishing composition according to claim 1, wherein the organic acid is at least one selected from the group consisting of a compound represented by the following Chemical Formula (1) and a compound satisfying the following Structure (2):
   Chemical Formula (1): R1—R2—R3, wherein R1 and R3 are each independently an acid group, and R2 is a single bond or a substituted or unsubstituted methylene group;

Structure (2): a compound having at least one acid group, and three or more of the acid group and a hydroxy group in the compound in total.

3. The polishing composition according to claim 2, wherein the acid group is at least one selected from the group consisting of a carboxylic acid group, a phosphonic acid group, and a sulfonic acid group.

4. The polishing composition according to claim 2, wherein the acid group is a carboxylic acid group.

5. The polishing composition according to claim 1, wherein the high dielectric constant layer includes an amorphous metal oxide.

6. A method for producing a polishing composition used to polish an object to be polished including a high dielectric constant layer, the method comprising:
   mixing an abrasive grain, water, and organic acid,
   wherein the abrasive grain is colloidal silica in which a silane coupling agent having an amino group or a silane coupling agent having a quaternary amino group is immobilized on the surface; and
   wherein when a zeta potential of the abrasive grain in the polishing composition is set as X [mV], and a zeta potential of the high dielectric constant layer during polishing using the polishing composition is set as Y [mV], X is positive, and Y−X≤−5 is established.

7. A polishing method comprising:
   a step of preparing an object to be polished including a high dielectric constant layer; and
   a step of polishing the object to be polished using the polishing composition according to claim 1.

8. A method for producing a semiconductor substrate, comprising:
   a step of polishing a semiconductor substrate including a high dielectric constant layer by the polishing method according to claim 7.

9. A polishing system comprising: an object to be polished including a high dielectric constant layer; a polishing pad; and a polishing composition,
   wherein the polishing composition contains an abrasive grain, water, and organic acid,
   wherein the abrasive grain is colloidal silica in which a silane coupling agent having an amino group or a silane coupling agent having a quaternary amino group is immobilized on the surface; and
   wherein a zeta potential of the abrasive grain in the polishing composition is set as X [mV], and a zeta potential of the high dielectric constant layer during polishing using the polishing composition is set as Y [mV], X is positive, and Y−X≤−5 is established, and
   a surface of the object to be polished is brought into contact with the polishing pad and the polishing composition.

10. The polishing system according to claim 9, wherein the organic acid is at least one selected from the group consisting of a compound represented by the following Chemical Formula (1) and a compound satisfying the following Structure (2):
    Chemical Formula (1): R1−R2−R3, wherein R1 and R3 are each independently an acid group, and R2 is a single bond or a substituted or unsubstituted methylene group;
    Structure (2): a compound having at least one acid group, and three or more of the acid group and a hydroxy group in the compound in total.

11. The polishing system according to claim 9, wherein the high dielectric constant layer includes an amorphous metal oxide.

* * * * *